United States Patent
Yamadaya

(10) Patent No.: US 9,564,821 B2
(45) Date of Patent: Feb. 7, 2017

(54) SWITCHING POWER SUPPLY DEVICE

(71) Applicant: FUJI ELECTRIC CO., LTD., Kawasaki (JP)

(72) Inventor: Masayuki Yamadaya, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 335 days.

(21) Appl. No.: 14/483,739

(22) Filed: Sep. 11, 2014

(65) Prior Publication Data

US 2014/0376276 A1    Dec. 25, 2014

Related U.S. Application Data

(63) Continuation of application No. PCT/JP2013/075376, filed on Sep. 19, 2013.

(30) Foreign Application Priority Data

Sep. 20, 2012  (JP) .................................. 2012-206752

(51) Int. Cl.
*H02M 3/335*    (2006.01)
*H02M 3/337*    (2006.01)
(Continued)

(52) U.S. Cl.
CPC ....... *H02M 3/33569* (2013.01); *H02M 3/3376* (2013.01); *H03K 5/04* (2013.01);
(Continued)

(58) Field of Classification Search
CPC ............. H02M 2001/0054; H02M 2001/0058; H02M 3/33507; H02M 3/33569; H02M 3/3376
See application file for complete search history.

(56) References Cited

U.S. PATENT DOCUMENTS

| 2008/0197817 A1 | 8/2008 | Colbeck et al. |
| 2009/0034298 A1* | 2/2009 | Liu ..................... H02M 3/3376 363/17 |

(Continued)

FOREIGN PATENT DOCUMENTS

| JP | 06-002990 A | 1/1994 |
| JP | 2005-039975 A | 2/2005 |

(Continued)

OTHER PUBLICATIONS

ISR issued in PCT/JP2013/075376, dated Nov. 26, 2013.
Fuji Electric Systems, M-Power 2C, Application Note, Mar. 2010, pp. 1-34. (Partial Translation provided).

*Primary Examiner* — Jessica Han
(74) *Attorney, Agent, or Firm* — Rossi, Kimms & McDowell LLP

(57) ABSTRACT

Included are a switching power supply device main body, and a frequency control circuit that controls the switching frequency of a switching element in accordance with a feedback signal in accordance with the output voltage of the switching power supply device main body. The frequency control circuit is divided into a frequency control region wherein the amount of the feedback signal is greater than a predetermined boundary value and a frequency control region wherein the amount is less, linear frequency control whereby the switching frequency of the switching element is caused to change linearly in accordance with the feedback signal is executed in the frequency control region wherein the feedback amount is less, and linear cycle control whereby the switching cycle of the switching element is caused to change linearly in accordance with the feedback signal is executed in the frequency control region wherein the feedback amount is greater.

8 Claims, 8 Drawing Sheets

(51) Int. Cl.
*H03K 5/04* (2006.01)
*H02M 1/00* (2006.01)

(52) U.S. Cl.
CPC ............... *H02M 2001/0054* (2013.01); *H02M 2001/0058* (2013.01); *Y02B 70/1491* (2013.01)

(56) References Cited

U.S. PATENT DOCUMENTS

| | | | |
|---|---|---|---|
| 2010/0302817 A1 | 12/2010 | Usui | |
| 2012/0314454 A1* | 12/2012 | Hosotani | ........... H02M 3/33507 363/21.01 |
| 2013/0128623 A1* | 5/2013 | Hosotani | ........... H02M 3/33523 363/21.01 |

FOREIGN PATENT DOCUMENTS

| | | |
|---|---|---|
| JP | 2009-171837 A1 | 7/2009 |
| JP | 2010-279118 A | 12/2010 |

\* cited by examiner

SWITCHING POWER SUPPLY DEVICE

CROSS-REFERENCE TO RELATED APPLICATIONS

This application is a continuation of International Application No. PCT/JP2013/075376, filed on Sep. 19, 2013, and is based on and claims priority to Japanese Patent Application No. JP 2012-206752, filed on Sep. 20, 2012. The disclosure of the Japanese priority application and the PCT application in their entirety, including the drawings, claims, and the specification thereof, are incorporated herein by reference.

BACKGROUND

Field of the Invention

Embodiments of the present invention relate to a current resonant type switching power supply device such that oscillation of a feedback control loop is prevented, thus obtaining stabilization of a switching operation.

Discussion of the Background

FIG. 5 is a schematic configuration diagram of a current resonant type switching power supply device typified by an LLC type of converter device. This kind of current resonant type switching power supply device includes first and second switching elements Q1 and Q2, connected in series to form a half-bridge circuit, that alternately switch an input voltage Vin. The first switching element Q1 is connected in series to a primary coil P of an insulating transformer T in series via a capacitor Cr and inductor Lr. Also, the second switching element Q2 is connected in parallel to the primary coil P of the insulating transformer T via the capacitor Cr and inductor Lr. Further, an output circuit formed of diodes D1 and D2 and an output capacitor Cout is connected to secondary coils S1 and S2 of the insulating transformer T.

The switching power supply device is such that, after the first switching element Q1 is turned on, causing current to flow through the primary coil P, the second switching element Q2 is turned on, generating current resonance in a resonant circuit formed of the capacitor Cr, inductor Lr, and a leakage inductor Lm of the insulating transformer T. The switching power supply device is such that alternating current is caused to flow through the primary coil P of the insulating transformer T by the heretofore described operation being repeated. Also, the output circuit is such that alternating voltage generated in the secondary coils S1 and S2 of the insulating transformer T is rectified via the diodes D1 and D2 and smoothed in the output capacitor Cout, whereby a predetermined output voltage Vout is obtained.

CONT in FIG. 5 is a control circuit that alternately drives the first and second switching elements Q1 and Q2. The control circuit is formed of an oscillator that generates a drive signal of a switching frequency fs. Also, VS is an output voltage detector circuit that detects the output voltage Vout and generates a feedback signal FB in accordance with the output voltage Vout. The control circuit CONT controls the switching frequency fs of the first and second switching elements Q1 and Q2 in accordance with the feedback signal FB provided from the output voltage detector circuit VS, thereby keeping the output voltage Vout constant.

FIG. 6 schematically shows the concept of a feedback control loop of the switching power supply device. The control circuit CONT alternately drives the first and second switching elements Q1 and Q2 in a switching power supply device main body SW at the switching frequency fs. Also, the output voltage detector circuit VS detects the output voltage Vout of the switching power supply device main body SW, and generates the feedback signal FB in accordance with the detected output voltage Vout. The feedback signal FB is formed of a feedback voltage $V_{FB}$ or a feedback current $I_{FB}$. The control circuit CONT controls the switching frequency fs (=f(Vout)) by converting the frequency of this kind of feedback signal FB. For example, as introduced in detail in JP-A-2009-171837 ("PTL 1"), the input/output voltage ratio (voltage conversion ratio) in the switching power supply device main body SW is changed, and the output voltage Vout is kept constant, by control of the switching frequency fs.

Herein, the input/output voltage ratio in the switching power supply device changes depending on the switching frequency fs, and changes as shown in FIG. 7 in accordance with the size of a load resistance Ro. Specifically, the input/output voltage ratio increases along with an increase in the switching frequency fs and, after reaching a maximum at a certain frequency fr, gradually decreases, as shown in FIG. 7. Further, when the switching frequency fs reaches a resonance frequency fo of the current resonant circuit, the input/output voltage ratio becomes "1".

Therefore, the switching power supply device is normally configured so that the input/output voltage ratio is constantly in a step-up mode of "1" or more. Specifically, the switching power supply device is configured so as to carry out modulation control of the switching frequency fs in accordance with the feedback signal FB between the frequency fr, at which the input/output voltage ratio reaches the maximum value, and the resonance frequency fo.

However, the previously described control of the switching frequency fs, that is, frequency modulation control, is realized by variably controlling the switching frequency fs linearly, or variably controlling a switching cycle Ts linearly, in accordance with the feedback voltage $V_{FB}$ or feedback current $I_{FB}$ provided as the feedback signal FB. The switching cycle Ts has a relationship of (fs=1/Ts) with respect to the switching frequency fs. Consequently, when the switching cycle Ts is linearly controlled, there are non-linear control characteristics such that the lower the feedback voltage $V_{FB}$, the greater the change in the switching frequency fs, as shown by a solid line in FIG. 8.

Herein, when linear control of the switching frequency fs is executed when the input voltage Vin or output voltage Vout of the switching power supply device changes, gain in the resonant circuit rises considerably along with an increase in the feedback voltage $V_{FB}$, as shown by a broken line in FIG. 9. Further, when the feedback voltage $V_{FB}$ increases, gain in the previously described feedback control loop increases. Thereupon, the feedback control loop itself oscillates, and there is concern that operation will become unstable.

Regarding this point, by executing linear control of the switching cycle Ts, the rise in the resonant circuit gain can be suppressed more in comparison with when executing linear control of the switching frequency fs, as shown by a solid line in FIG. 9. Conversely, however, when the feedback voltage $V_{FB}$ decreases, the switching frequency fs increases in comparison with when executing linear control of the switching frequency fs, and the feedback control loop gain also increases. Thereupon, for example, there occur problems such as inrush current, or the like, being liable to occur when the switching power supply device is started-up.

SUMMARY

Embodiments of the invention provide a current resonant type of switching power supply device such that the defects involved in each of the switching linear frequency control and switching linear cycle control are eliminated, and oscillation of the feedback control loop, the occurrence of inrush current when starting-up, and the like, are prevented, thus achieving stabilization of switching operations.

A switching power supply device according to an embodiment of the invention includes a switching power supply device main body that switches input voltage via a switching element, applies the voltage to a current resonant circuit, and obtains a predetermined output voltage from the current resonant circuit, and a frequency control circuit that controls the switching frequency of the switching element in accordance with a feedback signal in accordance with the output voltage of the switching power supply device main body.

In particular, the switching power supply device according to an embodiment of the invention is such that, in the frequency control circuit, switching frequency control regions are divided into a frequency control region wherein the feedback amount of the feedback signal is greater than a predetermined boundary value and a frequency control region wherein the feedback amount is less. Further, the frequency control circuit is such that linear frequency control whereby the switching frequency of the switching element is caused to change linearly in accordance with the feedback signal is executed in the frequency control region wherein the feedback amount is less. Also, the frequency control circuit is characterized in that linear cycle control whereby the switching cycle of the switching element is caused to change linearly in accordance with the feedback signal is executed in the frequency control region wherein the feedback amount is greater.

The frequency control circuit may include a comparator, which compares the charge voltage of a capacitor charged by a current supply and a voltage provided from a voltage supply and inverts the output, and an oscillator formed of a flip-flop, which is set and reset in accordance with the output of the comparator, generates a pulse width modulated drive signal for the switching element, and causes the capacitor to be discharged by the drive signal, thus initializing the charge voltage.

The linear frequency control is executed by keeping the output current of the current supply constant and causing the output voltage of the voltage supply to change in accordance with the feedback signal, and the linear cycle control is executed by causing the output current of the current supply to change in accordance with the feedback signal and keeping the output voltage of the voltage supply constant.

The frequency control circuit, with the size of the feedback signal when there is a reverse in the relationship between the sizes of the feedback control loop gain when the linear frequency control is executed and the feedback control loop gain when the linear cycle control is executed as the boundary value, selectively executes the linear frequency control and linear cycle control. Specifically, the frequency control circuit executes the linear frequency control when the feedback signal is smaller than the boundary value, and executes the linear cycle control when the feedback signal is greater than the boundary value.

According to the switching power supply device with the heretofore described configuration, when modulating the switching frequency of the switching power supply device main body based on a feedback signal in accordance with the output voltage of the switching power supply device main body, thus controlling the output voltage, linear frequency control and linear cycle control are switched in accordance with the size of the feedback signal. In particular, the switching power supply device is such that linear frequency control is executed when the feedback signal is smaller than the boundary value, and linear cycle control is executed when the feedback signal is greater than the boundary value. Consequently, according to embodiments of the invention, it is possible to suppress an unintended rise in feedback control loop gain, and easily and effectively prevent oscillation of the feedback control loop, the occurrence of inrush current when starting-up, and the like, thus achieving stabilization of switching operations.

DESCRIPTION OF EMBODIMENTS

Figure 1:
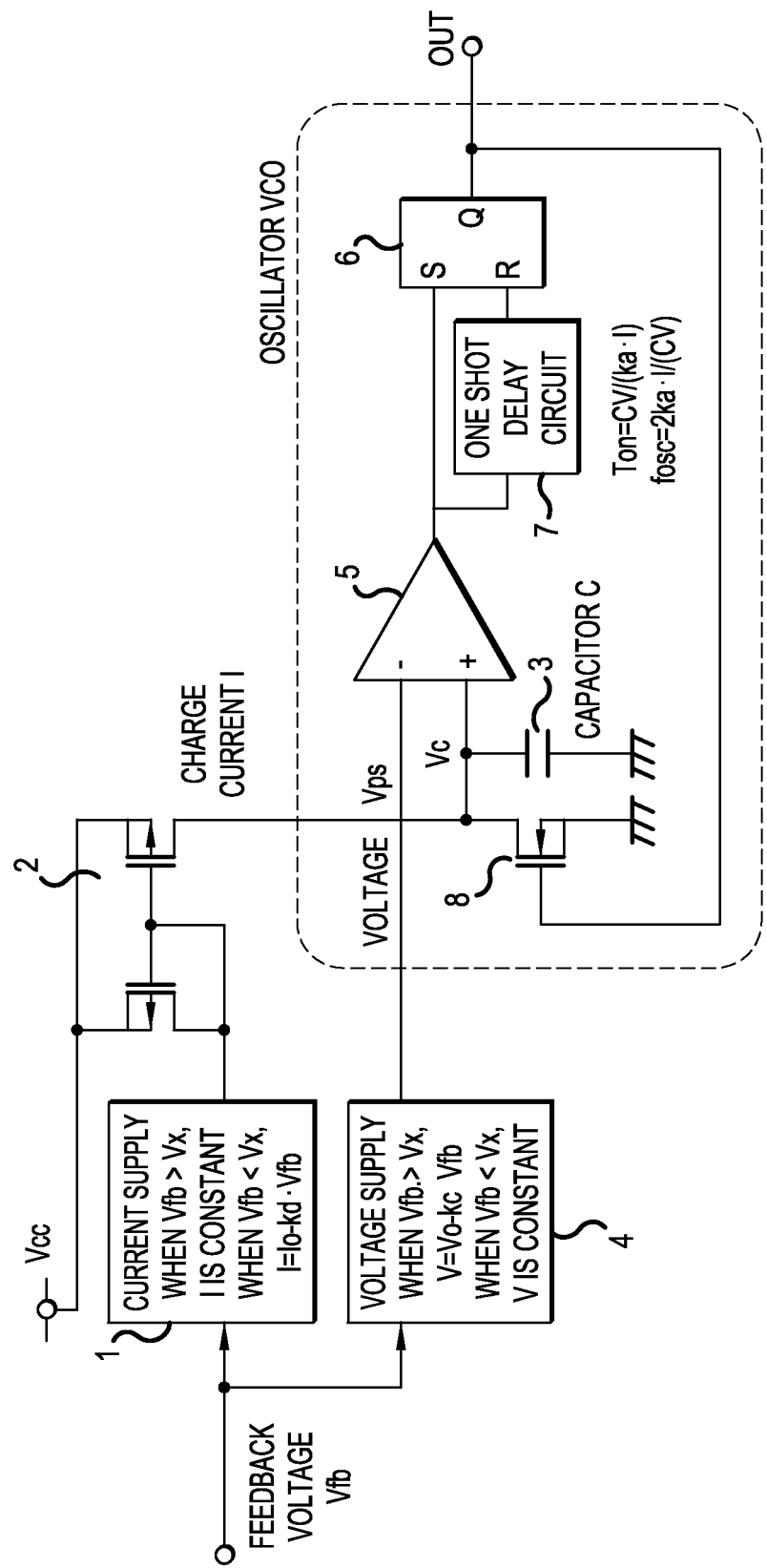
FIG. 1 is a diagram showing a configuration example of a frequency control circuit in a switching power supply device according to an embodiment of the invention.

Hereafter, referring to the drawings, a description will be given of a switching power supply device according to an embodiment of the invention.

Figure 5:
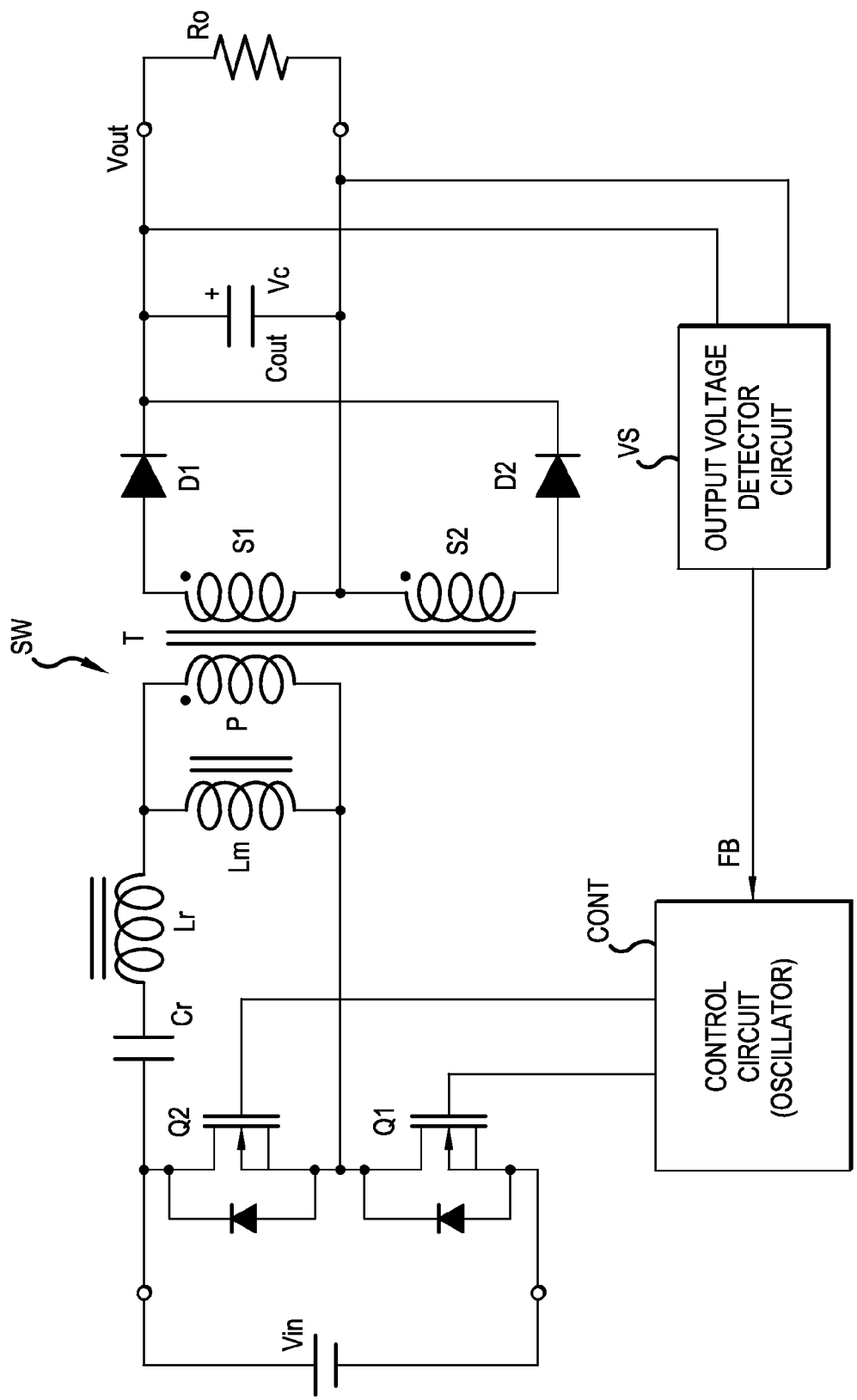
FIG. 5 is a main portion schematic configuration diagram of a current resonant type switching power supply device.
Figure 6:
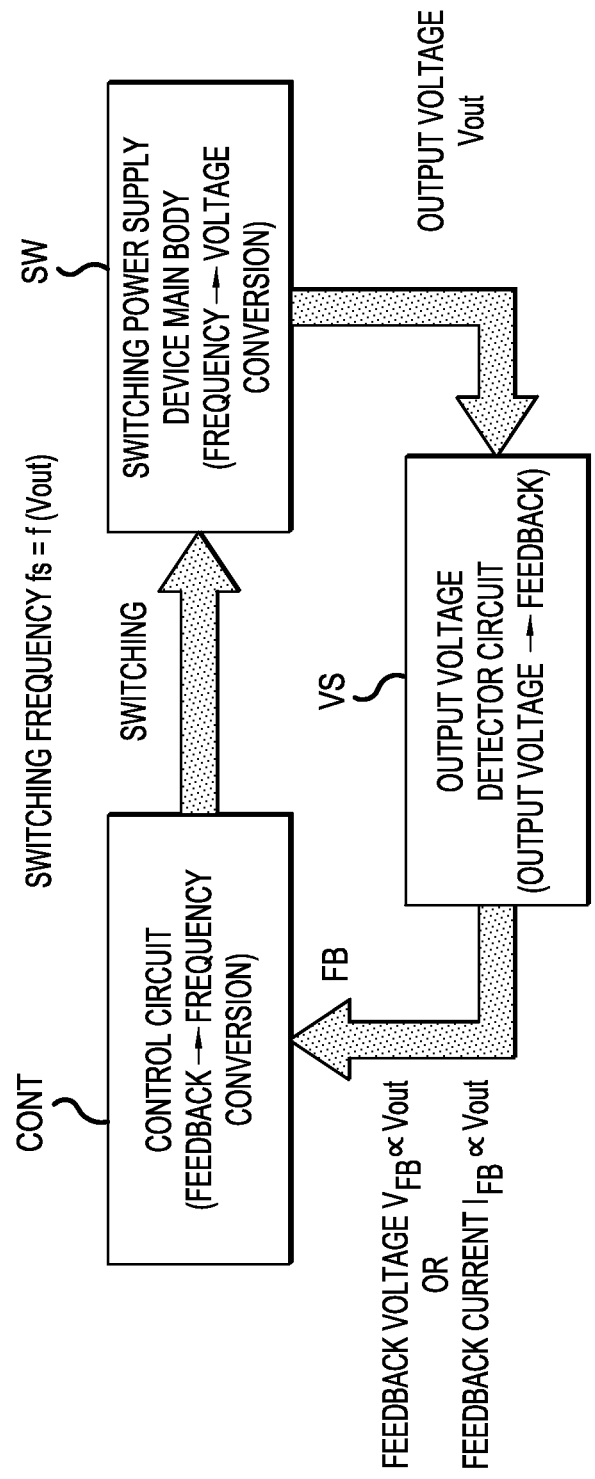
FIG. 6 is a diagram schematically showing the concept of a feedback control loop in the switching power supply device.
Figure 7:
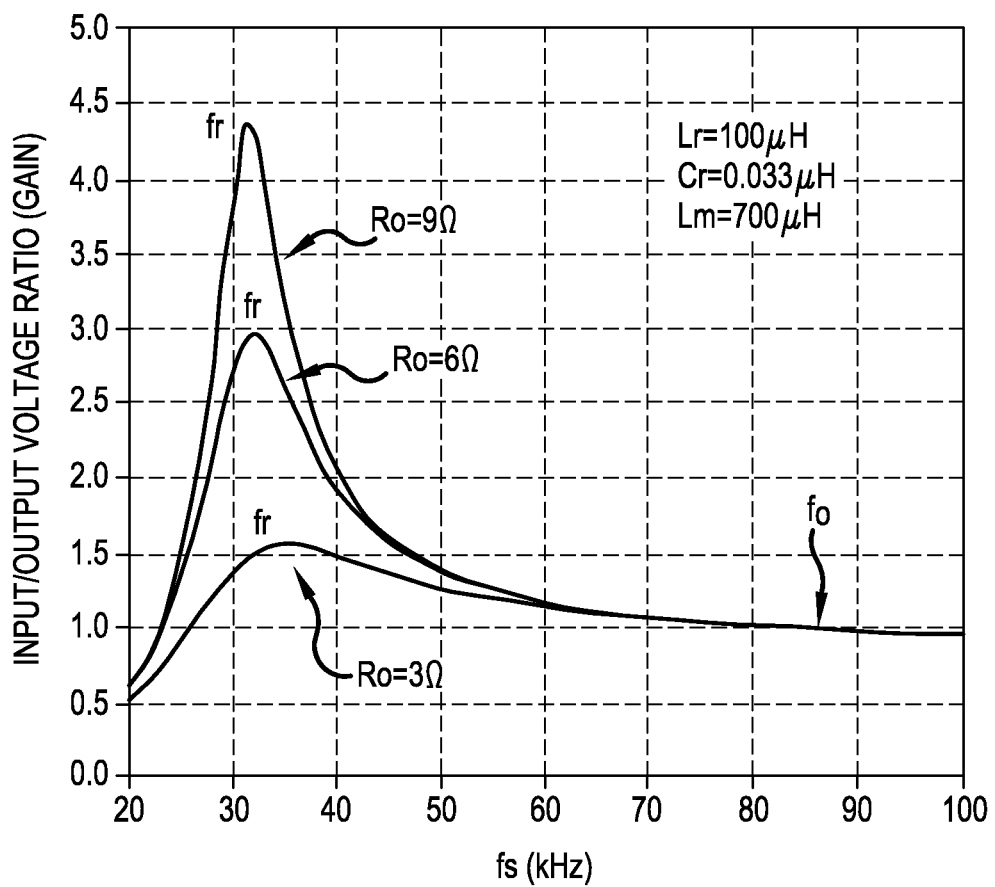
FIG. 7 is a diagram showing change characteristics of an input/output voltage ratio with respect to the switching frequency fs.
Figure 8:
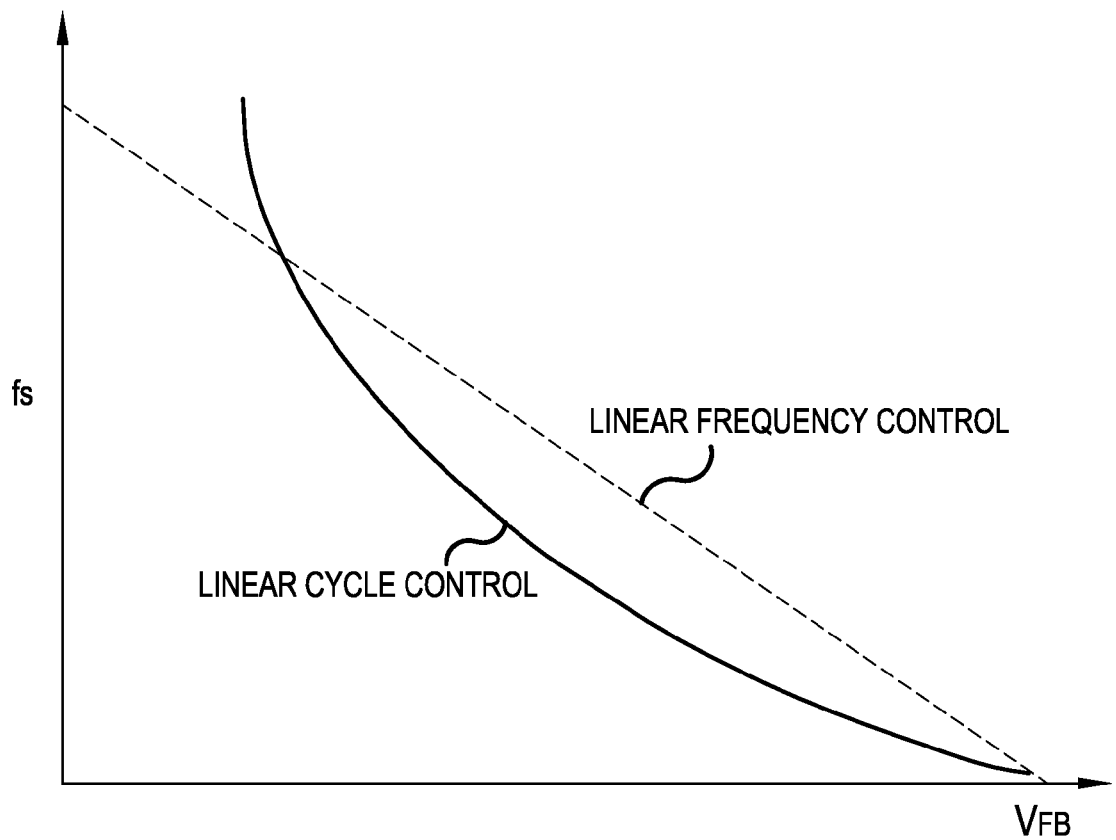
FIG. 8 is a diagram showing change characteristics of the switching frequency fs with respect to the feedback voltage $V_{FB}$.
Figure 9:
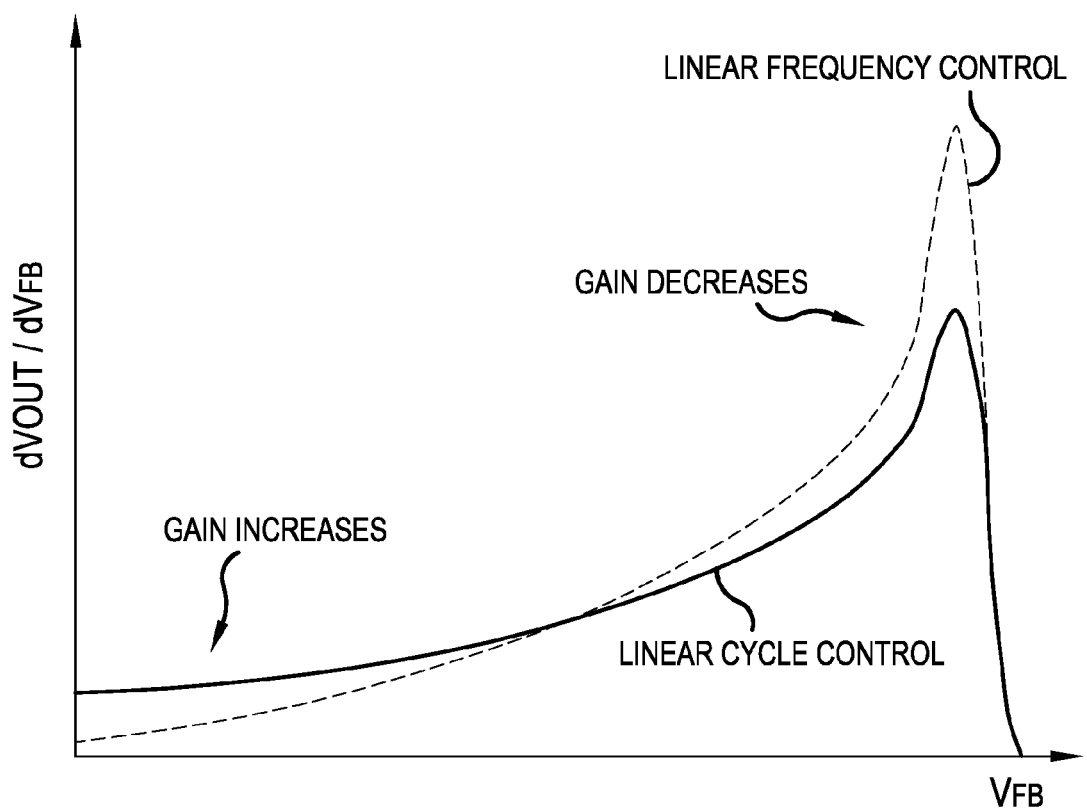
FIG. 9 is a diagram showing change characteristics of the feedback control loop gain with respect to the feedback voltage $V_{FB}$.

The switching power supply device is basically configured to include, for example, an LLC type of resonant circuit, in the same way as a heretofore known device shown in FIG. 5. Consequently, a description of the overall configuration of the switching power supply device will be omitted. FIG. 1 shows a schematic configuration of a main portion of the control circuit CONT in the switching power supply device according to the embodiment. In particular, FIG. 1 shows a configuration of a frequency control circuit, provided in the control circuit CONT, that modulates a switching frequency fs for a switching power supply device main body SW in accordance with a feedback signal (feedback voltage $V_{FB}$) fed back from the output voltage detector circuit VS.

Herein, as shown in FIG. 1, an oscillator VCO in the frequency control circuit includes a capacitor 3, which is charged via a current mirror circuit 2 by a current supply 1, and a comparator 5, which compares a charge voltage Vc of the capacitor 3 and a voltage Vps provided from a voltage supply 4, and inverts the output. The comparator 5 carries out an inversion operation such that the output thereof is switched to H when the charge voltage Vc exceeds the voltage Vps, and the output thereof is switched to L when the charge voltage Vc drops below the voltage Vps.

The output of the comparator 5 is input into the set terminal S of an RS-type flip-flop 6, and input via a one shot delay circuit 7 into the reset terminal R of the flip-flop 6. Consequently, the flip-flop 6 is set when the output of the comparator 5 becomes H, and reset a predetermined time after subsequently receiving the output of the one shot delay circuit 7. The output Q of the flip-flop 6 set and reset in this way is provided as a drive signal that prescribes the on-state period of the first switching element Q1 in the switching power supply device main body SW. The second switching element Q2 is turned on after a predetermined timing adjustment is performed subsequent to the first switching element Q1 being turned off, thus generating current resonance in the current resonant circuit.

Also, the drive signal that is the output of the flip flop 6 is applied to the gate of a switch element 8, formed of, for example, a MOSFET, connected in parallel to the capacitor 3. The switch element 8 is driven by the output of the flip-flop 6, and forms a discharge circuit that discharges a charge accumulated in the capacitor 3. Consequently, the capacitor 3 is repeatedly charged and discharged in a cycle Tc (=(C·Vps)/k·I) fixed by capacitance C of the capacitor 3, charge current I thereof, and the voltage Vps. Herein, k is a constant.

The switching element Q1 configuring the half-bridge circuit is driven so as to switch by the drive signal that is the output of the flip-flop 6. Consequently, the switching frequency fs of the switching power supply device main body SW in which a half-bridge circuit is configured of the first and second switching elements Q1 and Q2, as shown in FIG. 5, is provided as the reciprocal (2·I/(C·Vps)) of two cycles of the charge/discharge cycle Tc of the capacitor 3.

Herein, the switching power supply device according to an embodiment of the invention is characterized by being configured so as to be divided in accordance with the size of the feedback voltage $V_{FB}$ into a frequency control region with a large amount of feedback and a frequency control region with a small amount of feedback, wherein the functions of the current supply 1 and voltage supply 4 are changed in accordance with the frequency control regions. That is, the current supply 1 is such that the output current I thereof is kept constant when the size of the feedback voltage $V_{FB}$ is greater than a preset boundary value Vx ($V_{FB}$>Vx). Also, the current supply 1 is such that, when the size of the feedback voltage $V_{FB}$ is less than the boundary value Vx ($V_{FB}$<Vx), the output current I thereof is caused to change as (Io−kd·$V_{FB}$) in accordance with the feedback voltage $V_{FB}$. Herein, Io is the reference output current of the current supply 1, kd is a coefficient, and (kd·$V_{FB}$) indicates a current in accordance with the feedback voltage $V_{FB}$.

The voltage supply 4 is such that the output voltage Vps thereof is caused to change as (Vo−kc·$V_{FB}$) in accordance with the feedback voltage $V_{FB}$ when the size of the feedback voltage $V_{FB}$ is greater than the preset boundary value Vx ($V_{FB}$>Vx). Also, the voltage supply 4 is such that, when the size of the feedback voltage $V_{FB}$ is less than the boundary value Vx ($V_{FB}$<Vx), the output voltage Vps thereof is kept constant. Herein, Vo is the reference output voltage of the voltage supply 4, kc is a coefficient, and (kc·$V_{FB}$) indicates a voltage in accordance with the feedback voltage $V_{FB}$.

Consequently, according to the oscillator VCO in the switching power supply device configured as heretofore described, the output current of the current supply 1 is kept constant, and the output voltage Vps of the voltage supply 4 changes linearly as (Vo−kc·$V_{FB}$) in accordance with the feedback voltage $V_{FB}$, when the feedback voltage $V_{FB}$ is greater than the boundary value Vx ($V_{FB}$>Vx). As a result of this, the charge/discharge cycle Tc of the capacitor 3 is:

$$Tc=C(Vo-kc \cdot V_{FB})/(k \cdot I).$$

Consequently, the oscillation cycle of the oscillator VCO is controlled linearly with respect to the feedback voltage $V_{FB}$. That is, linear cycle control is executed.

Also, when the feedback voltage $V_{FB}$ is less than the boundary value Vx ($V_{FB}$<Vx), the output current of the current supply 1 changes linearly as (Io−kd·$V_{FB}$) in accordance with the feedback voltage $V_{FB}$, and the output voltage Vps of the voltage supply 4 is kept constant. As a result of this, the charge/discharge cycle Tc of the capacitor 3 is:

$$Tc=C \cdot Vos/\{k \cdot (Io-kd \cdot V_{FB})\}.$$

Further, the switching frequency fs of the switching power supply device main body SW provided as a reciprocal of two cycles of the charge/discharge cycle Tc of the capacitor 3 is:

$$fs=2k \cdot (Io-kd \cdot V_{FB})/(C \cdot Vps).$$

Consequently, the oscillation frequency of the oscillator VCO is controlled linearly with respect to the feedback voltage $V_{FB}$. That is, linear frequency control is executed.

According to the oscillator VCO configured so as to switch the functions of the current supply 1 and voltage supply 4 in accordance with the feedback voltage $V_{FB}$, as heretofore described, it is possible to switch frequency modulation control in the feedback control loop between linear frequency control and linear cycle control in accordance with the size of the feedback voltage $V_{FB}$. In particular, as shown in an outline of frequency modulation control in FIG. 2, linear frequency control is executed when the feedback voltage $V_{FB}$ is less than the boundary value Vx ($V_{FB}$<Vx). Conversely, linear cycle control is executed when the feedback voltage $V_{FB}$ is greater than the boundary value Vx ($V_{FB}$>Vx).

Figure 2:
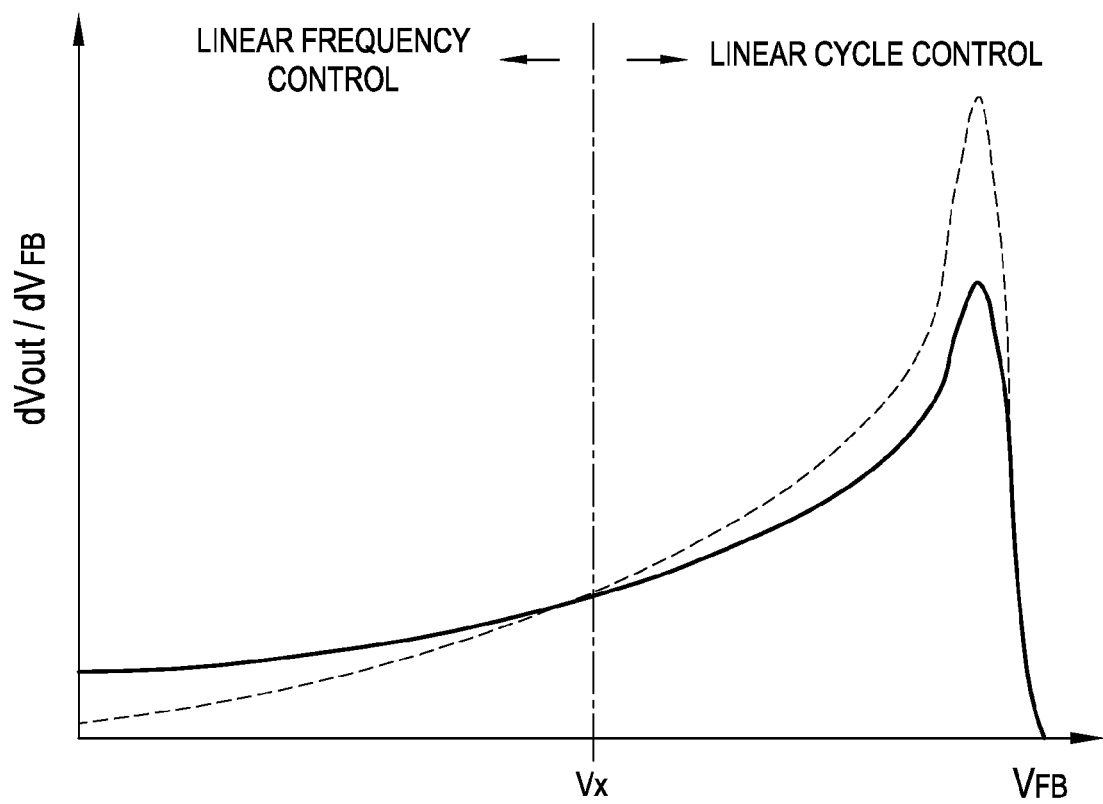
FIG. 2 is a diagram showing the concept of frequency modulation control in the switching power supply device according to the invention.

As a result of this, an unintended rise in gain in the feedback control loop when the feedback voltage $V_{FB}$ is high can be suppressed by linear cycle control, as shown in FIG. 2, and it is thus possible to forestall oscillation of the feedback control loop. Also, when the feedback voltage $V_{FB}$ is low, rise in gain in the feedback control loop can be suppressed by linear frequency control. Consequently, it is possible to effectively prevent the occurrence of inrush current, or the like, when the switching power supply device is started-up.

Figure 3:
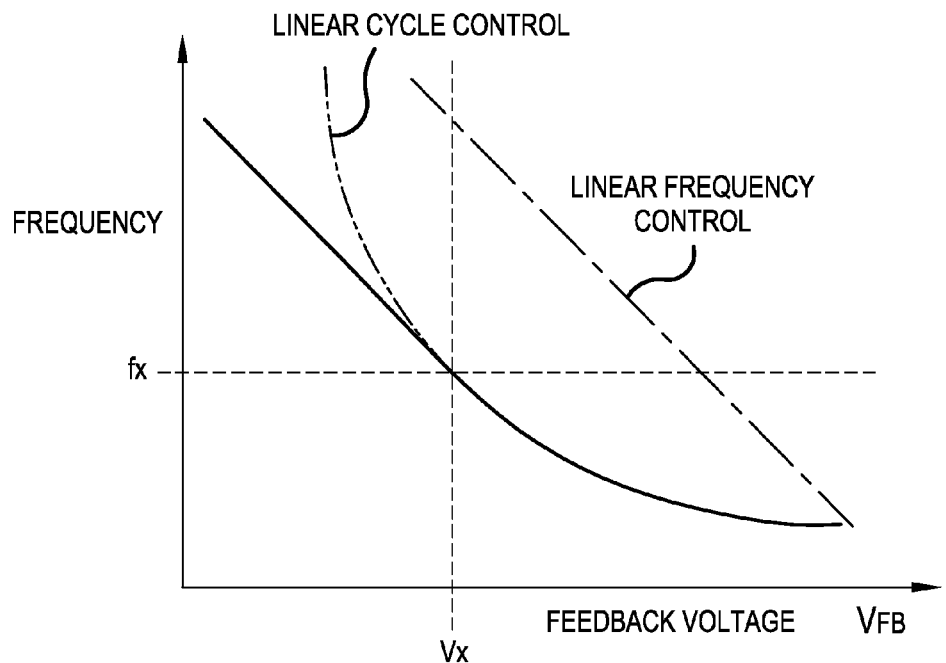
FIG. 3 is a diagram showing change characteristics of a switching frequency fs with respect to a feedback voltage $V_{FB}$ with the frequency modulation control shown in FIG. 2.

The relationship between the feedback voltage $V_{FB}$ and a switching frequency fc in the switching power supply device is shown by a solid line in FIG. 3. Also, in FIG. 3, characteristics when a heretofore known linear frequency control is executed independently are shown by a chain line, and characteristics when a linear cycle control is executed independently are shown by a two-dot chain line.

Figure 4:
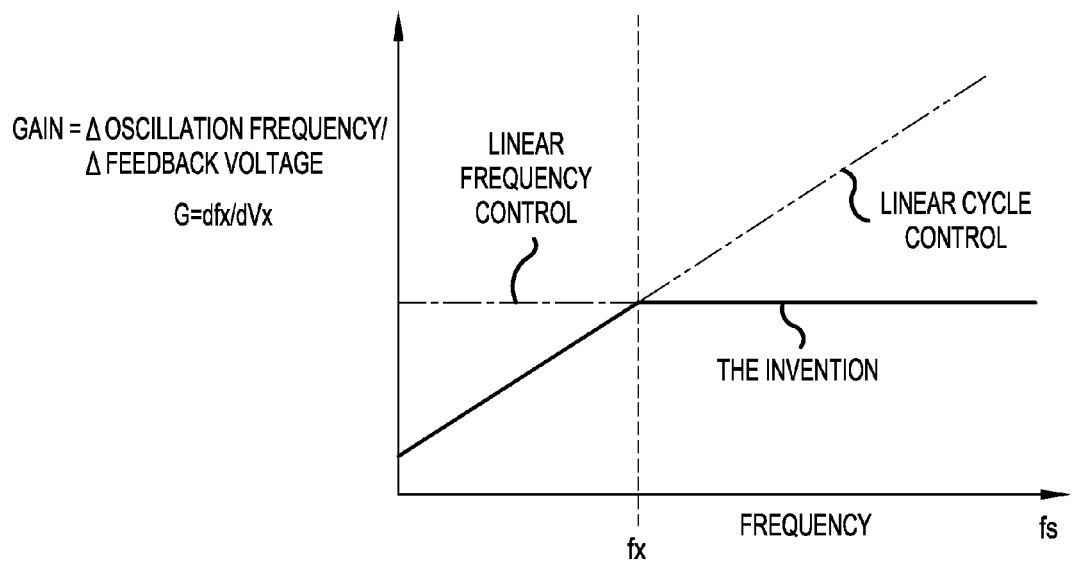
FIG. 4 is a diagram showing gain characteristics (oscillation frequency/feedback voltage) with respect to the switching frequency fs with the frequency modulation control shown in FIG. 2.

Also, the relationship between the switching frequency fc and feedback control loop gain (=oscillation frequency/feedback voltage) in the switching power supply device is shown by a solid line in FIG. 4. Furthermore, in FIG. 4, characteristics when a heretofore known linear frequency control is executed independently are shown by a chain line, and characteristics when a linear cycle control is executed independently are shown by a two-dot chain line.

According to the frequency modulation control according to an embodiment of the invention, as shown by the contrasts in each of FIG. 3 and FIG. 4, the linear frequency control and linear cycle control are selectively executed, because of which it is possible to keep feedback control loop gain low over the whole of a variable control range (fr to fo) in accordance with the feedback signal of the switching frequency fc, that is, the feedback voltage $V_{FB}$. Consequently, it is possible to prevent problems such as an unintended oscillation of the feedback control loop. Moreover, simply by switching between linear frequency control and linear cycle control in accordance with the feedback voltage $V_{FB}$, it is possible to easily obtain stabilization of the feedback control loop, which is of enormous practical advantage.

Herein, it is sufficient that the boundary value Vx with respect to the feedback voltage $V_{FB}$ when switching between linear frequency control and linear cycle control is determined based on, for example, the relationship between the feedback voltage $V_{FB}$ and feedback control loop gain shown in FIG. 2. That is, it is sufficient that the point of intersection between the gain characteristics obtained from the linear frequency control and the gain characteristics obtained from the linear cycle control, that is, the feedback voltage $V_{FB}$ when the gains are equal, is fixed as the boundary value Vx for control switching. Also, the boundary value Vx may be determined by an operation based on a circuit constant of the feedback control loop, or may be determined in accordance with measurement data based on experiment. Further, when the boundary value Vx is determined, each of the coefficients in the current supply 1 and voltage supply 4 may be determined based on the boundary value Vx.

The invention is not limited to the heretofore described embodiment. Herein, a description has been given with a converter device in which is configured the half-bridge circuit shown in FIG. 5 as an example, but it goes without saying that the invention is applicable in the same way to frequency modulation control in various kinds of heretofore known current resonant type switching power supply device. Also, it is not necessary to describe how the invention is also applicable when executing frequency modulation control in accordance with a feedback current $I_{FB}$. That is, various modifications are possible without departing from the scope of the invention.

The invention claimed is:

1. A switching power supply device, comprising:
   a switching power supply device main body configured to switch an input voltage via a switching element, to apply the switched voltage to a current resonant circuit, and to obtain an output voltage from the current resonant circuit; and
   a frequency control circuit configured to control a switching frequency of the switching element in accordance with a feedback signal corresponding to the output voltage of the switching power supply device main body, wherein
   the frequency control circuit is configured to control switching in a first frequency control region wherein a feedback amount of the feedback signal is greater than a threshold value and in a second frequency control region wherein the feedback amount is less than the threshold value, to execute linear frequency control whereby the switching frequency of the switching element is caused to change linearly in accordance with the feedback signal in the second frequency control region, and to execute linear cycle control whereby a switching cycle of the switching element is caused to change linearly in accordance with the feedback signal in the first frequency control region.

2. The switching power supply device according to claim 1, wherein
   the frequency control circuit comprises:
   a comparator configured to compare a charge voltage of a capacitor charged by a current supply and a voltage provided from a voltage supply and invert the output, and
   an oscillator comprising a flip-flop, which is set and reset in accordance with the output of the comparator, configured to generate a pulse width modulated drive control signal for the switching element, and to cause the capacitor to be discharged by the drive control signal, thus initializing the charge voltage, and
   wherein the frequency control circuit is configured to execute the linear frequency control by keeping the output current of the current supply constant and causing the output voltage of the voltage supply to change in accordance with the feedback signal, and to execute the linear cycle control by causing the output current of the current supply to change in accordance with the feedback signal and keeping the output voltage of the voltage supply constant.

3. The switching power supply device according to claim 1, wherein
   the frequency control circuit, with the size of the feedback signal at which there is a reverse in the relationship between the sizes of the feedback control loop gain when the linear frequency control is executed and the feedback control loop gain when the linear cycle control is executed as the threshold value, is configured to execute the linear frequency control when the feedback signal is smaller than the threshold value, and to execute the linear cycle control when the feedback signal is greater than the threshold value.

4. The switching power supply device according to claim 1, wherein
   the current resonant circuit comprises an LLC resonant circuit.

5. A method of switching in a power supply device, comprising:
   switching an input voltage via a switching element;
   applying the switched voltage to a current resonant circuit;
   obtaining an output voltage using the current resonant circuit;
   receiving a feedback signal corresponding to the output voltage; and
   controlling the switching element according to a magnitude of the received feedback signal, such that the switching frequency of the switching element is changed when the magnitude of the received feedback signal is less than a threshold value, and the switching cycle of the switching element is changed when the magnitude of the received feedback signal is more than the threshold value.

6. The method according to claim 5, wherein receiving the feedback signal comprises receiving the feedback signal by a current supply and by a voltage supply.

7. The method according to claim 6, wherein
   the switching frequency of the switching element is changed by keeping an output current of the current supply constant and changing an output voltage of the voltage supply in accordance with the magnitude of the feedback signal, and
   the switching cycle of the switching element is changed by changing the output current of the current supply in accordance with the magnitude of the feedback signal and keeping the output voltage of the voltage supply constant.

8. The switching power supply device according to claim 7, wherein
the switching frequency of the switching element is linearly changed, and
the switching cycle of the switching element is linearly changed.

* * * * *